United States Patent [19]
Baker et al.

[11] Patent Number: 5,198,282
[45] Date of Patent: Mar. 30, 1993

[54] TANDEM CERAMIC COMPOSITE

[75] Inventors: Anna L. Baker, Seattle; Kristina S. Preedy, Redmond, both of Wash.

[73] Assignee: The Boeing Company, Seattle, Wash.

[21] Appl. No.: 106,746

[22] Filed: Oct. 8, 1987

Related U.S. Application Data

[63] Continuation-in-part of Ser. No. 698,496, Feb. 5, 1985, Pat. No. 5,041,321, which is a continuation-in-part of Ser. No. 667,568, Nov. 2, 1984, abandoned.

[51] Int. Cl.⁵ .............................................. G32G 5/12
[52] U.S. Cl. ..................................... 428/114; 428/116; 428/117; 428/118; 428/374; 428/688; 264/257; 264/259; 264/271.1
[58] Field of Search ............... 428/116, 117, 118, 119, 428/374, 688; 264/257, 259, 271.1

[56] References Cited

U.S. PATENT DOCUMENTS

| | | | |
|---|---|---|---|
| 4,254,171 | 3/1981 | Beggs et al. | 428/116 |
| 4,271,219 | 6/1981 | Brown | 428/116 |
| 4,294,329 | 10/1981 | Rose et al. | 428/118 |
| 4,314,852 | 2/1982 | Brennan et al. | 501/88 |
| 4,318,453 | 3/1982 | Rose et al. | 428/118 |
| 4,421,811 | 12/1983 | Rose et al. | 428/116 |
| 4,435,455 | 3/1984 | Prewo et al. | 428/36 |
| 4,485,179 | 11/1984 | Brennan et al. | 428/902 |
| 4,539,244 | 9/1985 | Beggs et al. | 428/116 |
| 4,770,930 | 9/1988 | Wrenn et al. | 428/285 |

OTHER PUBLICATIONS

Rice et al, Refractory-Ceramic-Fiber Composites: Progress, Needs, and Opportunities, Ceramic Proc., Sep. Oct. 1982, pp. 698-713.

Levitt, High-strength graphite fibre/lithium aluminosilicate composites, 8 J. of Materials Sci. pp. 793-806 (1973).

*Primary Examiner*—Stephen J. Lechert, Jr.
*Attorney, Agent, or Firm*—John C. Hammar

[57] ABSTRACT

The composite comprises ceramic fiberformed insulation bonded to a fiber reinforced ceramic matrix laminate. Ceramic insulation has a mat of intersecting, discrete ceramic fibers bonded with a sol-gel glass binder. The insulation is prepared by forming a slurry of ceramic fibers, molding the slurry to form a soft felt mat, drying the mat, and incrementally introducing the binder into the mat with a multiple-impregnation technique, which controls shrinkage of the ceramic fiber mat. This process provides a layering technique that permits formation of a continuous fibrous structure having layers that impart distinct characteristics at desired regions within the structure. By using different ceramic fibers and fibers of differing physical dimension, or by including additives with the slurries, tailoring of the physical characteristics of the insulation is achieved.

The reinforced ceramic matrix laminate is laid up on the ceramic insulation in a wet lay-up technique and includes a continuous ceramic fiber reinforcement and a cementaceous matrix that includes a ceramic filler, like mullite; ceramic reinforcing whiskers, such as silicon nitride or silicon carbide whiskers; and a binder, such as colloidal silica. An activator may also be used in the matrix. Matrix is worked into the ceramic insulation and fiber reinforcement during the lay-up.

The tandem composite exhibits resistance to high temperatures for extended exposure without degradation and possesses improved flexural strength over conventional ceramics made without exotic pressure fabricating processes. The tandem composite can readily be formed into complex curvatures and can include integral mounting flanges (strengthened with the matrix laminate) for fastening the composite to structural materials.

25 Claims, 1 Drawing Sheet

TANDEM CERAMIC COMPOSITE

REFERENCE TO RELATED APPLICATIONS

This application is a continuation-in-part application based upon U.S. patent application Ser. No. 698,496 filed Feb. 5, 1985, U.S. Pat. No. 5,041,321 which was a continuation-in-part application based upon U.S. patent application Ser. No. 667,568 filed Nov. 2, 1984, now abandoned.

TECHNICAL FIELD

This invention relates generally to a tandem ceramic composite and its method of manufacture.

BACKGROUND ART

In aerospace systems, such as engine exhaust ducts, nose cones, firewalls, and reentry shield surfaces, surfaces may be exposed to high temperatures or large temperature gradients and must, accordingly, be insulated. Each application has unique problems which have rendered it difficult to provide an adequate thermal insulation that can be tailored for optimum performance in that application.

Recently, low-density ceramic fibers have been used for insulating aerospace surfaces. For example, the space shuttle's exterior surface is insulated with a plurality of ceramic tiles that are arranged in a closely spaced, ordered array. To provide the required fit, each tile is cut precisely from a fused ceramic blank. To form the blanks, silica fibers and other ceramic components were initially mixed into a slurry and cast into blocks. After drying, the blocks were sintered to form strong ceramic bonds between the overlapping fibers. The blocks were cut into smaller blanks that were subsequently milled into the final tiles. Each tile was bonded to an isolation pad with a high-temperature adhesive. The pad was, then, bonded to the underlying metallic substructure of the shuttle.

Especially during takeoff and reentry, a differential surface temperature distribution exists over the surface of the space shuttle. The fused ceramic tiles are vulnerable to shear forces caused by the differential surface temperature distribution. To prevent breakage, each tile must be small (generally less than ten inches on a side) thereby creating enormous fabrication and assembly costs.

Glass coatings have been developed to improve thermal shock resistance for ceramics. In U.S. Pat. No. 4,093,771, Goldstein discloses a borosilicate glass coating that is used on the surface of reusable silica insulation. In U.S. Pat. No. 4,381,333, Stewart discloses a two-layer glass coating for silica insulation. The base layer has a high emittance and is preferably formed by combining a reactive borosilicate glass with an emittance agent, such as silicon tetraboride, silicon hexaboride, boron, or silicon carbide. The outer layer is formed from discrete, sintered glass particles to provide a high scattering coefficient. Preferably, fused silica or a reactive borosilicate glass having a higher silica content than the base layer is used for the outer layer. In either the Goldstein or Stewart ceramics, the coating is sprayed onto the underlying fiber insulation before firing to form a glass.

Insulation may be formed with an unsolidified silica glass felt sandwiched between silica glass fiber cloth. The three layers are stitched together with silica glass thread (or another suitable refractory thread) and are bonded with adhesive to the surface to be protected. Similarly, a layering effect may be achieved by superposing a stitched blanket of silica and aluminoborosilicate fibers (commercially available under the trademark NEXTEL from 3M Company) over a separate, stitched blanket of silica fibers. By staggering the blankets and using suitable emittance coatings on the outer surfaces of the blankets, control of the insulative characteristics can be achieved, thereby countering the temperature distribution on and gradient through the insulation.

Lightweight fibrous insulation that permits a wide range of design choices in terms of insulative characteristics, strength, and durability is still needed.

Fiberformed ceramic insulation with surprising physical properties is described in U.S. Ser. No. 698,496, and is made by forming a slurry of ceramic fibers, molding the slurry to form a soft felt mat, drying the mat, and incrementally introducing a sol-gel glass binder into the mat to form a rigid mat. The incremental addition of the sol-gel binder is accomplished through a unique multiple impregnation technique in which a small amount of binder is initially impregnated into the mat, is gelled, and is cured to stabilize the mat dimensionally, allowing handling and further processing of the mat. The mat is strengthened thereafter to its final strength by successive additions of glass binder. This technique cures the mat to a rigid, predetermined shape without appreciable shrinking of the resultant structure, and is contrasted with prior processes in which the entire binder is introduced either in one impregnation of the mat or by incorporating the binder in the fiber-containing slurry prior to the molding or felting operation. U.S. Pat. No. 3,702,279 to Ardary et al. and U.S. Pat. No. 3,935,060 to Blome et al. exemplify these prior processes.

By forming a plurality of slurries containing different ceramic fibers, and molding each of the slurries in succession to form a single felt mat having interlocking layers of fibers, the thermal and mechanical characteristics of the resulting insulation can be controlled over a wide range. By using longer fibers, the insulation can be strengthened where desired, as for example, in the region that is joined to the skin or substructure Where a particular application requires further resistance to high temperatures or to large temperature gradients, a layer of high emittance can be formed at desired locations within the continuous fiber mat by including an emittance agent, such as boron or silicon carbide, in one or more slurry. A desired insulative profile can also be obtained by using ceramic fibers of different materials in the different slurries, thereby countering the effect of the temperature distribution on the surface. With these controllable variables and others, insulation can be made for a wide range of applications.

A vacuum-felting process tends to align the ceramic fibers parallel to the forming surface, producing an anisotropic material having reduced flatwise tensile strength. This anisotropic material can be mechanically strengthened by stitching the mat with glass or other high-temperature refractory thread in a direction that is normal or at angles to the mat fibers. If the mat has layers, the stitching provides additional connection between the layers. Stitching can also be used to anchor the glass fabric of the coating to the mat.

The fiberformed insulation usually includes a network of ceramic fibers that are disposed in a plurality of layers, with fibers within each layer intersecting other fibers within the same layer. Some fibers within each layer intersect fibers in adjacent layers. To strengthen the layered network, sol-gel glass bonds are formed where the ceramic fibers intersect.

SUMMARY OF THE INVENTION

The tandem ceramic composite of the present invention is an improvement to the fiberformed ceramic insulation of U.S. Ser. No. 698,496. A fiber-reinforced ceramic matrix laminate provides added strength or toughness to allow the fiberformed ceramic to be attached to other materials by conventional fasteners, such as bolts. The fiber-reinforced ceramic matrix laminate comprises a cementaceous fiber matrix carried in a ceramic fiber (cloth) that can be laid up on the surface of the fiberformed ceramic insulation, and fired at relatively low temperature to complete the tandem ceramic composite. The laminate allows the properties of the tandem ceramic composite to be tailored in density, thickness, plies, and surface coverage. The product can be used in many applications where it is otherwise difficult, impossible, or impractical to provide thermal protection, including products having complex curvature.

DETAILED DESCRIPTION OF THE INVENTION

Ceramic insulation for space applications must be resistant to at least three heat transfer regimes. First, it must be able to withstand high absolute temperatures. Second, it must be able to resist large temperature gradients across the insulation caused by a large temperature difference between the interior of the vessel and the environment or between a heat source in the vehicle and other portions of the vehicle. Third, the insulation must be able to withstand large temperature gradients at different portions of the surface since one portion may be hot while another nearby portion may be cold. The insulation of the present invention fulfills these general goals with a tandem ceramic composite.

Figure 1:
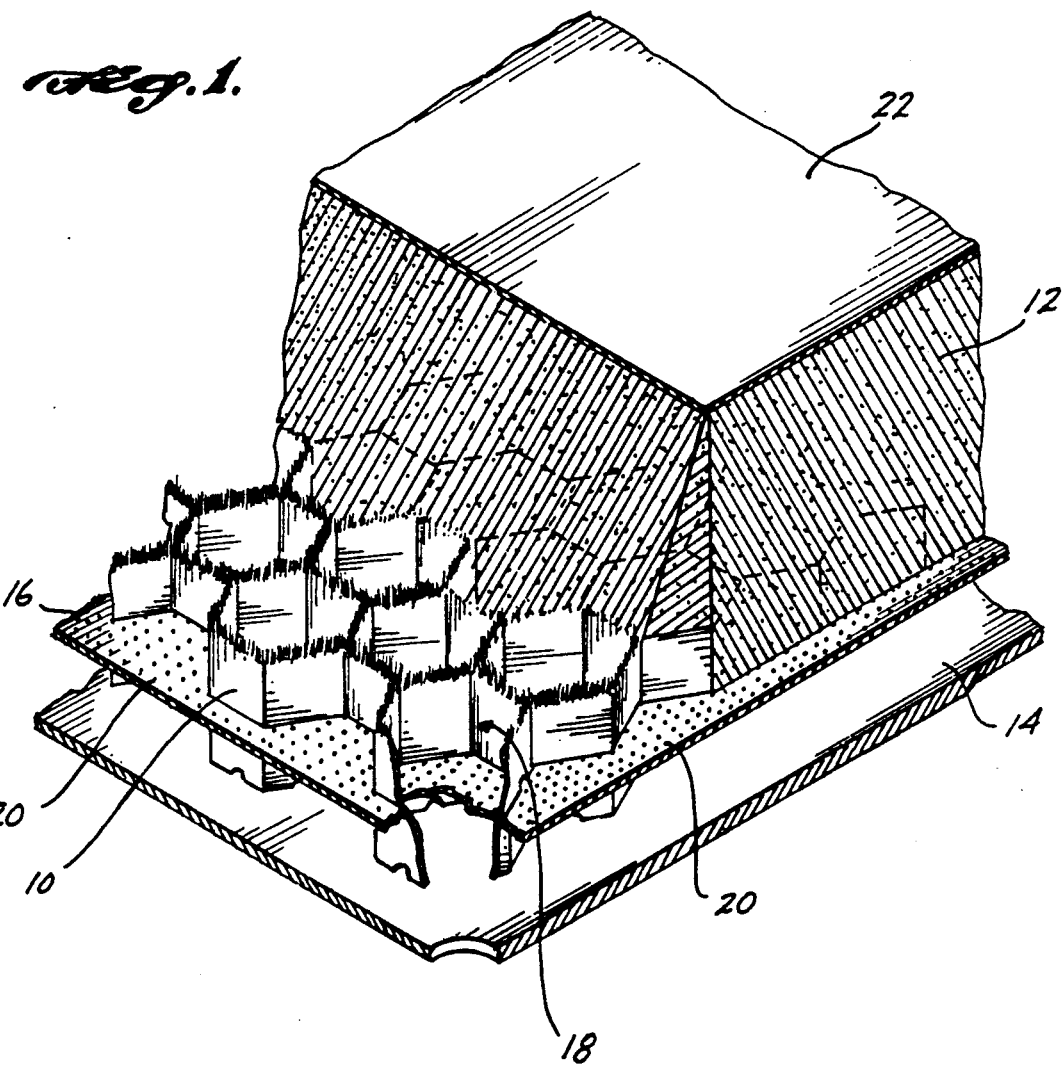
FIG. 1 is an isometric of a preferred tandem ceramic composite of the present invention.

A mat of discrete ceramic fibers that selectively intersect one another in a semi-random fashion is bonded with a sol-gel glass binder that forms bonds between the fibers at their intersections. An impact resistant coating (generally of glass having a glass fiber cloth reinforcement) may be bonded on at least one surface of the mat to provide impact resistance. This fiberformed insulation may be formed in a variety of shapes including flat structures, hollow cylinders, frustums (i.e. cones), or other complex shapes. The insulation may be bonded directly to the surface to be protected, formed on a substrate that is subsequently attached to the surface, or fastened to the surface by using a tandem composite flange. A honeycomb core 10 (FIG. 1) may be used to position a layer of the fiberformed insulation 12 in spaced relation to an underlying surface 14 to provide thermal protection for the surface 14 through enhanced conductive and convective thermal resistance. A septum 16 within the core 10 divides each cell 18 into inner and outer cavities. The fiberformed ceramic insulation 12 fills only the outer cavities. This arrangement is preferably achieved by vacuum casting the insulation 12 into the outer cavities of the honeycomb core 10 by drawing a vacuum through perforations 20 in the septum 16 to draw at least one slurry of the fibers into the outer cavities of the cells 18. The fibers are then bonded together to form the ceramic insulation 12. A matrix laminate 22 forms an impact-resistant coating that completes this honeycomb tandem composite, as will be described.

With a sol-gel glass binder in a ceramic fiber mat, gelling of the binder at the junctions of the intersecting fibers ordinarily shrinks the mat. Some degree of shrinkage can be tolerated where the formed insulation mat is machined into the final configuration, as in prior art processes. Where the ceramic fiber is to be formed in situ, such as in honeycomb, however, shrinkage is more critical and, often, cannot be tolerated. The multiple impregnation technique of the present invention controls the shrinkage of the ceramic fiber mat and is optimally suited for use where such control is essential.

An aqueous slurry of ceramic fibers is thoroughly mixed to provide a substantially uniform dispersion of the fibers. The slurry generally comprises from about 0.2–0.5 weight percent alumino-silicate fibers and from about 99.5–99.8 weight percent water, but other fibers of silica, alumina, mullite (commercially available under the trademark ULTRAFIBER 440 from 3M Company), zirconia, silicon nitride, or mixtures thereof may be used at different concentrations, as desired. It may be desirable to use fibers of different materials to tailor the insulative characteristics or density of the insulation. For instance, a mat having distinct layers of alumina and aluminosilicate fibers would be useful at higher temperatures. Fibers of mullite or of an alumina-zirconia mixture would reduce the density of the resulting insulation without substantially affecting the temperature limit for the insulation.

The length and diameter of the fibers effects the characteristics of the insulation. Generally, the length of the fibers should be between about one-sixteenth and four inches, while the diameter of the fibers should range between about one and three microns. Shorter fibers can be used with conventional cellulose fiber-felting aids. The preferred fibers are about one-quarter inch in length and about one micron in diameter. Longer fibers produce an insulation of increased strength.

The binder is preferably an alumina sol-gel glass that can be prepared using conventional techniques. Other sol-gel glasses may be used. For example, a silica sol-gel glass or a sol-gel glass of similar composition to the particular fiber in the mat may be used, if desired.

After the slurry has been thoroughly mixed, it is pulled by vacuum through a filtered mold to form a soft felt mat of fibers on the mold. Through selection of the mold, the felt mat can be formed in a variety of shapes, including those with irregular, curved surfaces and those with open interiors, such as hollow cylinders and frustums.

The soft felt mat, usually without the mold, is heated to a temperature of about 200° F. (93° C.) to remove all water from the mat. The best green strength for the dried mat is obtained when the majority of fibers are about one-quarter inch in length and about one micron in diameter. The duration of drying will, of course, depend upon the size and shape of the mat.

Once the mat has been dried, a sol-gel glass binder is introduced in incremental stages. This incremental addition of binder limits shrinkage of the mat and assures good distribution of the binder throughout the mat.

Surprisingly higher densities and greater strength for the insulation results. Incremental addition of the binder involves repeating the steps of impregnating the mat with binder, gelling the binder, and curing the mat and binder. Preferably, a light coating of binder is applied in the first stage with an air-dry gellation to stabilize the fiber mat dimensionally. Thereafter, the steps of impregnating, gelling, and curing are repeated one or more times until the total binder is added. The density and strength of the resulting insulation can be controlled with this multiple binder impregnation technique. Because the configuration of the molded fiber mat is precisely maintained, the process is particularly suited to applications where shrinkage of the mat is a prime concern. Precise parts in varied shapes are achievable without further machining.

The impregnating step may be accomplished by any suitable process, including wicking, spraying, or vacuum infiltrating. Spraying is preferred.

After impregnation, the binder is converted to a rigid gel, usually by air drying or by subjecting the binder impregnated mat to an atmosphere of ammonia gas. Since the ammonia sol reaction is exothermic and vigorous, there is a tendency for bubbles to form in the mat if ammonia is used. This problem is avoided, however, by allowing the first binder to gel in air. Thereafter trapped bubbles are not as serious a problem, and ammonia gellation can be used.

After gelling the binder, the mat is cured, first, by heating the mat to about 200° F. (93° C.) for about four hours, then, by slowly increasing the temperature to about 600° F. over a five-hour period, holding the temperature at 600° F. (316° C.) for about one to two hours, and cooling the mat to ambient temperature.

Figure 3:
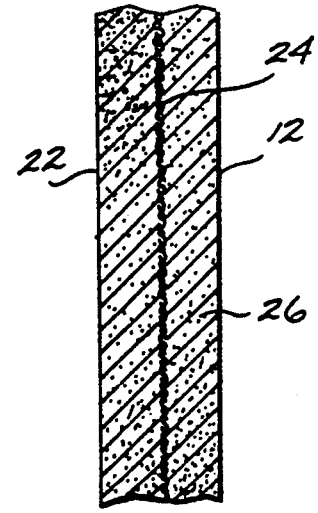
FIG. 3 is a partial cross-sectional view taken generally along line 3—3 of FIG. 2.

The fiber-reinforced ceramic matrix laminate 22 used in the tandem composite generally is made by removing any sizing from the continuous ceramic fiber reinforcement 24 (FIG. 3) in accordance with the manufacturer's standard instructions. The fiber reinforcement may be in tow or woven fabric form, and is usually an aluminoborosilicate glass fiber cloth (NEXTEL 312, 440, or 480). The tow form should be converted to a tape by winding the tow. A cementaceous filler, such as high purity mullite ($3Al_2O_3.2SiO_2$) is generally mixed with silicon carbide or silicon nitride whiskers, a colloidal silica binder, and an activating agent which polymerizes the binder to from a cementaceous matrix 26 (FIG. 3). The whiskers generally are high aspect ratio (L/D), single crystals. Silicon nitride whiskers suitable for this application can be prepared in accordance with the method described in U.S. Pat. No. 4,579,699 or 4,388,255, but other whiskers, such a Tateho silicon nitride can be used. The preferred binder is DuPont LUDOX AS-40 activated with a sodium-carbonate compound similar to the mineral trona. Naigai MMS grade (−325 ANSI mesh) mullite is preferred. The matrix generally comprises about 34.1 wt. % mullite, 7.6 wt. % whiskers, 56.7 wt. % colloidal silica binder, and 1.6 wt. % activator. The whiskers are added to the binder and sonicated to break up agglomerated whiskers and to mix the materials. Thereafter, a mixture of the mullite and activator are added and the matrix is sonicated again to ensure thorough mixing. The matrix is a fluid paint consistency that can be readily applied to the fiber reinforcement with a brush (or any other suitable means) to form the laminate.

Figure 2:
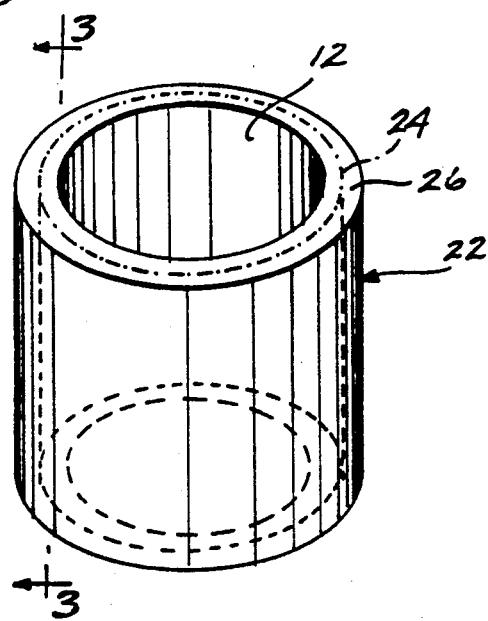
FIG. 2 is an isometric of another embodiment of the tandem ceramic composite of the present invention.

The laminate 22 (particularly with woven cloth reinforcement 24) is laid up over the desired surface of the fiberformed insulation 12 (FIGS. 2 & 3). The fiberformed ceramic insulation 12 generally is saturated with water to prevent or reduce migration of colloidal silica from the matrix laminate 22 into the insulation 12. The fiber reinforcement 24 in the laminate 22 is compressed against the surface to work the matrix 26 further into the reinforcement 24 and into the fiberformed insulation 12. Generally a squeegee and composite wet lay-up techniques are used to complete the composite. Additional matrix and/or fiber reinforcement can be applied during the lay-up as necessary to achieve the desired thickness. Although the figures show only one ply, multiple plies of laminate may be applied, as desired. The reinforcement may be oriented in any desired fashion over any desired shape or form. Slow drying in air at room temperature completes the "green" or preform composite, which is then cured by heating in an atmospheric, air recirculating oven at about 212° F. (100° C.) until the binder water is removed. Thereafter, the temperature is increased to about 600° F. (316° C.) and maintained until the composite reaches equilibrium at which point the binder is cured. The composite can be machined. Maximum strength and toughness for the composite can be achieved after final machining by a further heat treatment at about 1200° F. (649° C.). Following the final heat treatment, the composite can only be machined with diamond tools or a laser.

The tandem composite can be essentially any shape or size, because hot pressing to achieve the desired final properties is not required. Accordingly, the tandem composites are not limited to the small and simple shapes that can be made with hot pressing. A tandem composite of the nature just described fabricated into a test turbojet engine exhaust nozzle withstood five hours at 1500° F. (816° C.) without any apparent or detectable deterioration. Another test part having a complex curvature has been attached to an engine exhaust simulator through a flange fabricated into the part with the ceramic fiber matrix laminate.

In this application, the composite is a distinct improvement over the present state of the art because it allows complex curvatures of freestanding fibrous ceramic insulation to be easily attached to the structural materials of the liners, allowing high temperature cycling even in a high vibrational environment.

The matrix laminate 22 can withstand temperatures of at least about 1200°-2000° F. (649°-1093° C.) with little or no property degradation, and is a relatively tough ceramic material having a flexural stress in the range of 10,000-20,000 psi in 3-point bending. This toughness provides the essential characteristics required for many specialized aerospace application where conventional ceramics or organic (hydrocarbon) composites are unacceptable.

Preferably the fiberformed ceramic insulation 12 is heat treated at the intended use temperature prior to applying the matrix laminate 22.

Those skilled in the art will recognize that the optimum curing cycle for the composite may vary with the selection of components (especially the binder systems), the shape and thickness of the layers, and the chemical composition of each layer (i.e. relative proportions of the components).

Composites of this general type when used as exhaust liners should allow greater efficiency of the engines (higher speeds, lower operating costs, and greater fuel efficiency) by permitting the engines to operate at higher temperatures.

The mechanical strength of the composite might be enhanced by stitching the fiber mat with a suitable refractory thread, but this is not preferred. Since the vacuum-forming procedure tends to align the ceramic fibers parallel to the forming surface, the threads can be sewn in a pattern which orients the stitches in a predetermined direction to the fiber orientation. To further strengthen the fibrous insulation of the composite, the glass fiber cloth of the coating may be stitched to the mat, with the stitching preferably being done after initial addition and curing of the sol-gel glass binder so that the mat is dimensionally stabilized.

In prior fiberformed ceramic insulation where only a binder was used to hold the fibers together, the resultant structure was substantially homogeneous throughout. To improve the physical, thermal, and optical properties of these prior art insulations structures, it has been necessary to apply glass coatings to the outer surface of the insulation. For example, U.S. Pat. Nos. 4,381,333 and 4,093,771 use additives to increase the emittance of these glass coatings While these coatings exhibit satisfactory performance, it would be advantageous if control over the thermal, mechanical, and other characteristics of the insulation could be provided within the fibrous ceramic mat itself rather than only in an overlay coating. The insulation of the present invention satisfies this aim by including a layering technique, which permits formation of a continuous fiber structure having layers that impart distinct characteristics at desired regions within the structure. Slurries of different characteristics are applied at the desired locations to produce a felt mat having interlocking layers. The types of fibers, the physical dimensions of the fibers, the number of layers, and the slurry additives can be varied to achieve a continuous mat having the desired distribution of properties.

Improved properties can be obtained by curing the sol-gel binder in an ammonia or other nitrogen-containing gas atmosphere so that nitrogen replaces oxygen in the glass structure. Such a substitution results in enhanced fracture toughness, microhardness, refractory properties, and chemical durability. The method of nitrogen replacement is particularly beneficial when the mat includes additives for emission or conductance which are oxygen sensitive. The nitrogen atmosphere can protect these additives so that higher processing temperatures can be used. As explained by Brinker and Haaland for oxynitride glasses (J. of Am. Ceramic S., vol. 66, No. 11, p.758–765), nitrogen can interact with oxygen in the glass through hydrogen bonding, can interact with metals in the glass through Lewis acid adsorption, and can replace oxygen entirely through well-known chemical reactions at the surface. In this way, the 3-fold coordination of nitrogen can be introduced into the glass matrix to replace the 2-fold coordination of oxygen, and improves the glass. Nitrogen serves as a crosslinking agent which should increase the glass transition temperature. The microhardness should be increased as well as the sintering temperature, and the thermal expansion characteristics will probably be altered.

The following Examples illustrate preferred features of the present invention.

EXAMPLE I

A fiber slurry of 60 gallons of water and 300 grams of aluminosilicate fibers approximately 0.25 inches in length and one micron in diameter was mixed by circulating the components for 30 minutes through a polyethylene-lined, air-operated, double-diaphragm pump into a 90-gallon polyethylene tank. A filter mold was attached to the pump, and 30 gallons of slurry (about ½ the volume) were pulled through the mold, depositing about 150 grams of fiber in a soft mat on the surface of the mold. The mat was removed from the mold and was dried in a circulating-air oven at about 200° F. (93° C.) until all the water was removed.

An alumina sol-gel binder comprising about 459 grams of aluminum isopropoxide, 4053 grams of distilled water, and 18 grams of hydrochloric acid was refluxed at a controlled temperature for three days, and was, then, distilled to a solution containing seven grams of alumina per 100 cc.

The resulting sol was wicked into the dried fiber mat until the entire mat was saturated. To convert the sol to a gel, the saturated mat was placed in a sealed nylon bag with a small outlet tube that was connected to a bottle of ammonia gas. The bag was inflated with gas at a flow rate designed to keep the bag fully expanded. After one hour, the gas was turned off and the bag was opened, allowing the excess gas to escape. The fully gelled mat was removed from the bag, and cured for four hours in an air-circulating oven at about 200° F. After this initial four-hour period, the temperature was slowly increased to 600° F. (316° C.) over a five-hour period, before the temperature was rapidly lowered to 200° F. and maintained at 200° F. for two more hours. The resulting rigid mat had a density of 16 lb/ft$^3$ and a flexural strength of 200 psi.

A sheet of NEXTEL glass fiber cloth was cut to the size of the mat. The surface of the rigid mat was lightly wetted with the alumina sol-gel binder. The cloth, saturated with this binder, was placed on the surface of the mat. A slurry containing 100 grams of −325 mesh borosilicate glass powder and 50 grams distilled water was then brushed onto the cloth. The resulting composite assembly was then heated in an air-circulating oven at 200° F. until dried. The dried assembly was then heated for five minutes at 2000° F. to melt the borosilicate glass, before being removed from the oven to cool and solidify the glass.

EXAMPLE II

The process of Example I was followed to form a rigid mat, except that, after the fully gelled mat was cured, the impregnating, gelling, and curing steps were repeated by (1) resaturating the mat in two successive applications with the alumina sol binder, (2) exposing the saturated mat to ammonia gas for one hour, and (3) then, heating the mat with the same temperature regime as Example I to cure the second addition of binder. The mat had a density of 22 pounds/cubic foot and a flexural strength of 1200 psi, showing the surprising results achieved through incremental binding method of the present invention. The flexural strength increased sixfold by the incremental binding technique.

EXAMPLE III

Four slurries were prepared in the manner described in Example I. Slurry A had no additional ingredients. Slurries B, C, and D included about the following amounts of silicon carbide fibers (an emittance agent): 0.5 g for slurry B; 1.0 g for slurry C; and 3.0 g for slurry D. These four slurries were then molded into a soft felt mat using a filter mold attached to the pump. A first layer was laid down on the mold using 30 gallons of slurry A, depositing a 150-gram soft mat on the mold surface. Successive layers from slurries B, C, and D were deposited on the underlying layers. The resulting mat had a total weight of about 600 grams. This mat was then processed in an identical fashion to Example 1, but without the addition of the glass coating.

EXAMPLE IV

A cylindrical filter mold was used to form insulation from a slurry prepared in the same manner as the slurry of Example I. An open cylindrical soft fiber mat was formed and subsequently processed with three incremental additions of binder in the same manner described in Example II. A glass coating having a fiber cloth reinforcement was applied to the inner surface of the rigid mat following the procedure described in Example I.

EXAMPLE V

A slurry was prepared according to the method of Example I, and contained 750 g of zirconia fiber and 40 g of microcellulose fiber (a felting aid). Following the method of Example I, insulation was prepared, using three impregnations of alumina sol-gel binder. The product had a density of 36 lb/ft$^3$ and a flexural strength of about 314 psi.

EXAMPLE VI

A slurry was prepared according to the method of Example I, and contained a sufficient amount of UL-TRAFIBER 440, a mullite fiber available from 3M Co. After rigidifying in accordance with the method of Example I, using three impregnations of alumina sol-gel, the product had a density of about 19 lb/ft$^3$.

EXAMPLE VII

A cylinder was formed in accordance with the method of Example IV except that the first impregnation of sol-gel binder was not exposed to ammonia gas, but instead was dried in a circulating air oven at 160° F. (71° C.) and then heat treated to 600° F. (316° ) Two subsequent sol impregnations were done in ammonia, however, before drying and firing.

The ceramic fiber reinforced matrix laminate was prepared by the following method: The matrix was made by mixing 20 g of Tateho silicon carbide whiskers with 150 g of LUDOX AS-40 colloidal silica and mixed with a sonicator for 3 minutes. Ninety grams of Naigai mullite was mixed with 5 g of a trona-like mineral with a mortar and pestle and then added to the mixture of colloidal silica and whiskers. The resulting mixture was sonicated for 2 minutes.

A strip of Nextel 312 900 denier fabric was heat-cleaned following manufacturer's specifications. The fibrous ceramic cylinder was saturated with water to prevent migration of the colloidal silica from the matrix mixture. The matrix mixture was brushed onto the surface of the cylinder and on one side of the fabric strip. The strip was laid matrix side down on the cylinder and a squeegee was used to work the matrix material into the fabric. When the strip was about to overlap itself, another layer of matrix mixture was brushed on the outer fabric surface on the cylinder and the strip was allowed to overlap itself on top of the newly placed matrix mixture. A squeegee was used to work the matrix into the fabric.

A FEP film was placed over the surface and additional squeegeeing was done. After two days, the FEP film was removed, and the part was dried at room conditions for one day and then in an air circulating oven. After about 8 hours at 160° F. (71° C.), the temperature was raised gradually to 600° F. (316° C.) over about 4 hours, held at 600° F. for about 3 hours, raised again to 1200° F. (649° C.) over about 4 hours, and held at 1200° F. for 1 hour before cooling to room temperature in about 2 hours. Thereafter, the part was treated again in a 1500° F. oven for about 1 hour.

The resulting tandem composite cylinder was tested for 5 hours in a WR24-7 turbojet test at 1500° F. (816° C.) with no visible signs of deterioration.

Those skilled in the art will understand that the present invention provides a highly flexible approach to the formation of lightweight insulating structures that are suitable for use at high temperatures and with large temperature gradients. Since the multiple binder impregnation approach controls shrinkage during the forming process, the invention provides a means for precisely forming fibrous ceramic insulation of relatively high flexural strength. The product can be made in a variety of configurations. Those skilled in the art will also understand that other ceramic fibers, sol-gel binders, and emittance agents may be used in the process of the present invention. For example, silica, zirconia, mullite, aluminosilicate chromia, or mixtures of fibers may be used. Any inorganic material that can be converted from a sol to a glass may be used as the binder in the fiberformed insulation.

Other embodiments of the invention will also be apparent to those skilled in the art from a consideration of this specification. The specification and examples are illustrative only, and should be interpreted liberally to protect the invention. Therefore, the invention should be limited only as is necessary by construing the claims in light of this description and the pertinent prior art.

We claim:

1. A tandem ceramic composite comprising a fiberformed ceramic insulation bonded to a fiber reinforced ceramic cementaceous matrix laminate.

2. The composite of claim 1 wherein the fiberformed insulation comprises a mat of ceramic fibers, some of the fibers intersecting one another, and sol-gel glass bonds where the fibers intersect.

3. The composite of claim 2 wherein the bonds are prepared by sequential impregnating of portions of a sol-gel glass binder followed by sequential gelling and sequential curing.

4. The composite of claim 1 wherein the laminate is prepared by a wet lay-up technique on the fiberformed insulation so that a portion of a cementaceous matrix in the laminate penetrates into the fiberformed insulation.

5. The composite of claim 3 wherein the laminate is prepared by a wet lay-up technique on the fiberformed insulation so that a portion of a cementaceous matrix in the laminate penetrates into the fiberformed insulation.

6. The composite of claim 4 wherein the matrix includes a ceramic filler, ceramic whiskers, and a binder.

7. The composite of claim 5 wherein the matrix includes a ceramic filler, ceramic whiskers, and a binder.

8. The composite of claim 7 wherein the ceramic filler includes mullite.

9. The composite of claim 7 wherein the whiskers are selected from the group consisting of silicon nitride, silicon carbide, or mixtures thereof.

10. The composite of claim 7 wherein the binder includes colloidal silica.

11. The composite of claim 10 wherein the matrix includes an activator.

12. The composite of claim 11 wherein the activator includes a trona-like material including sodium and carbonate, the filler includes mullite, and the whiskers are selected from the group consisting of silicon nitride, silicon carbide, or mixtures thereof.

13. The composite of claim 12 wherein the fiber reinforcement includes aluminoborosilicate.

14. The composite of claim 13 wherein the ceramic fibers in the mat are selected from the group consisting of aluminosilicate, zirconia, and mullite fibers and wherein the sol-gel glass binder is a alumina sol-gel.

15. The composite of claim 14 wherein the mat includes at least two layers of ceramic fibers, the fibers in each layer being of different materials.

16. The composite of claim 14 wherein the bonds include nitrogen in place of at least some of the oxygen normally found in the glass.

17. A process for forming a tandem ceramic composite, comprising the steps of:
   (a) forming at least one slurry of ceramic
   (b) molding the slurry to form a soft felt mat having intersecting ceramic fibers;
   (c) drying the soft felt mat;
   (d) impregnating the mat with a portion of a sol-gel binder;
   (e) gelling the binder to form bonds at the intersections of the ceramic fibers so that the mat is dimensionally stabilized;
   (f) curing the gelled binder;
   (g) repeating each of steps d, e, and f at least once to complete the insulation;
   (h) laying up a fiber reinforced laminate including a fibrous reinforcement and matrix on the insulation; and
   (i) working at least a portion of the matrix into the insulation.

18. The method of claim 17 further comprising:
   (a) drying the laminate in air at ambient
   (b) heating the laminate in air to further dehydrate the laminate; and
   (c) raising the temperature of the laminate to at least about 600° F. to cure the laminate.

19. The method for claim 18 further comprising the step for heat treating the cured laminate at a temperature above 1000° F. to strengthen the composite and to improve its toughness.

20. A tandem ceramic composite made by the process of claim 19.

21. The method of claim 19 wherein at least one step of curing the gelled binder includes the substep of replacing oxygen in the glass with nitrogen by exposing the gelled binder to ammonia 22. A tandem ceramic composite, comprising:
   (a) a mat of ceramic fibers formed by curing in air a felted body of fibers with a portion of a sol-gel binder and then strengthening the body with repeated applications and curings of the binder; and
   (b) a continuous fiber reinforced cementaceous ceramic matrix laminate bonded to the cured mat, including a ceramic fiber reinforcement in tow or cloth form and a matrix including a filler, ceramic whisker reinforcement, and 23. The composite of claim 22 wherein the ceramic fiber reinforcement includes aluminoborosilicate, the filler includes mullite, and the whisker reinforcement is either silicon nitride or silicon carbide.

24. The composite of claim 23 wherein the ceramic fibers are aluminosilicate fibers having a length between about 1/16 to 4.0 in. and a diameter between about 1–3 microns and the sol-gel binder includes alumina.

25. The composite of claim 23 wherein at least one portion of binder in the mat is cured in a nitrogen-containing atmosphere that permits exchange of nitrogen for oxygen in the cured glass binder.

* * * * *